US010716227B2

(12) United States Patent
Heng

(10) Patent No.: US 10,716,227 B2
(45) Date of Patent: Jul. 14, 2020

(54) BENDING APPARATUS AND DISPLAY DEVICE

(71) Applicant: SHANGHAI TIANMA AM-OLED CO., LTD., Shanghai (CN)

(72) Inventor: Lin Heng, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/184,939

(22) Filed: Nov. 8, 2018

(65) Prior Publication Data

US 2019/0075669 A1 Mar. 7, 2019

(30) Foreign Application Priority Data

Jun. 28, 2018 (CN) .......................... 2018 1 0685401

(51) Int. Cl.

*H05K 5/02* (2006.01)
*G06F 1/16* (2006.01)
*H05K 5/00* (2006.01)
*H01L 51/56* (2006.01)
*E05D 7/00* (2006.01)
*H01L 51/52* (2006.01)

(52) U.S. Cl.

CPC ......... *H05K 5/0226* (2013.01); *G06F 1/1624* (2013.01); *G06F 1/1652* (2013.01); *G06F 1/1681* (2013.01); *H05K 5/0017* (2013.01); *E05D 7/00* (2013.01); *E05Y 2900/606* (2013.01); *H01L 51/5237* (2013.01); *H01L 51/56* (2013.01); *H01L 2251/5338* (2013.01)

(58) Field of Classification Search

CPC .... G06F 1/1652; G06F 1/1624; G06F 1/1616; G06F 1/1681; H04M 1/0268; H04M 1/0235; H04M 1/0237; H05K 5/0017; H05K 5/0226

See application file for complete search history.

(56) References Cited

U.S. PATENT DOCUMENTS

2010/0246113 A1* 9/2010 Visser ................... G06F 1/1601 361/679.3
2016/0216737 A1* 7/2016 Hayk .................... G06F 1/1652
2016/0252930 A1* 9/2016 Senatori ................ G06F 1/1616 361/679.27
2017/0169741 A1* 6/2017 Lim .......................... G09F 9/00
2018/0059727 A1 3/2018 Seo et al.

FOREIGN PATENT DOCUMENTS

CN 107799010 A 3/2018
CN 207068367 * 3/2018

* cited by examiner

*Primary Examiner* — James Wu

(74) *Attorney, Agent, or Firm* — Kilpatrick Townsend & Stockton, LLP

(57) ABSTRACT

A bending apparatus and a display device are provided. The bending apparatus includes a first supporting portion, a second supporting portion and a bending portion. Each of the first supporting portion and the second supporting portion is formed by a retractable plate-shaped structure. The bending portion rotatably connected to the first supporting portion and the second supporting portion. The first supporting portion and the second supporting portion are retractable such that the bending portion can be moved relative to the first supporting portion and the second supporting portion. In this case, a bendable position of the bending apparatus can be changed, such that the bending apparatus is bendable at multiple positions.

14 Claims, 12 Drawing Sheets z y x 111 112 111 112 111 11 212 21 212 211 z x 15 17 15 18 16 28 24 26 27 25 26 30 14

31
32
37
33
34
35
38
36

BENDING APPARATUS AND DISPLAY DEVICE

CROSS REFERENCE OF RELATED APPLICATION

This application claims the priority to Chinese Patent Application No. 201810685401.3, titled "BENDING APPARATUS AND DISPLAY DEVICE", filed on Jun. 28, 2018 with the Chinese Patent Office, which is incorporated herein by reference in its entirety.

FIELD

The present disclosure relates to the field of display devices, and in particular to a bending apparatus and a display device.

BACKGROUND

With continuous development of display technologies, display panels are becoming more and more widely used. Organic light emitting diode (OLED) display panels become the mainstream of the display panel industry due to the advantages of a fast response speed, bright colors, and a thin and bendable structure.

A display device equipped with an OLED display panel is generally provided with a bending apparatus for assisting bending of the OLED display panel, such that the OLED display panel can exhibit an excellent bendable property.

However, a conventional bending apparatus is bendable at only a single position, which cannot meet the requirement of users of bending the flexible display panel at multiple positions.

SUMMARY

To solve the above problem, a bending apparatus and a display device are provided according to the present disclosure, such that a flexible display panel is bendable at multiple positions.

A bending apparatus is provided, including a first supporting portion, a second supporting portion and a bending portion.

Each of the first supporting portion and the second supporting portion is formed by a retractable plate-shaped structure:

The first supporting portion is rotatably connected to the bending portion.

The second supporting portion is rotatably connected to the bending portion.

A display device is provided, including a flexible display panel and a bending apparatus. The bending apparatus is the aforementioned bending apparatus. The bending apparatus includes the first supporting portion, the second supporting portion and the bending portion.

An end of the first supporting portion away from the bending portion is fixedly connected to the flexible display panel, and an end of the second supporting portion away from the bending portion is fixedly connected to the flexible display panel.

The bending apparatus and the display device are provided according to the embodiments of the present disclosure. The bending apparatus includes a first supporting portion, a second supporting portion and a bending portion. Each of first supporting portion and the second supporting portion is formed by a retractable plate-shaped structure.

The bending portion is rotatably connected to the first supporting portion and the second supporting portion. The first supporting portion and the second supporting portion are retractable such that the bending portion can be moved relative to the first supporting portion and the second supporting portion. In this case, a bendable position of the bending apparatus can be changed, such that the bending apparatus is bendable at multiple positions.

Moreover, since the bending apparatus is bendable at multiple positions, a bendable position of the flexible display panel is not fixed, thereby avoiding the problem that service life and reliability of the flexible display panel may be reduced due to multiple bends at the same position for a long time.

BRIEF DESCRIPTION OF THE DRAWINGS

The drawings to be used in the description of the embodiments of the disclosure will be described briefly as follows. It is apparent that the drawings in the following description only illustrate some embodiments of the present disclosure.

DETAILED DESCRIPTION OF THE EMBODIMENTS

Figure 1:
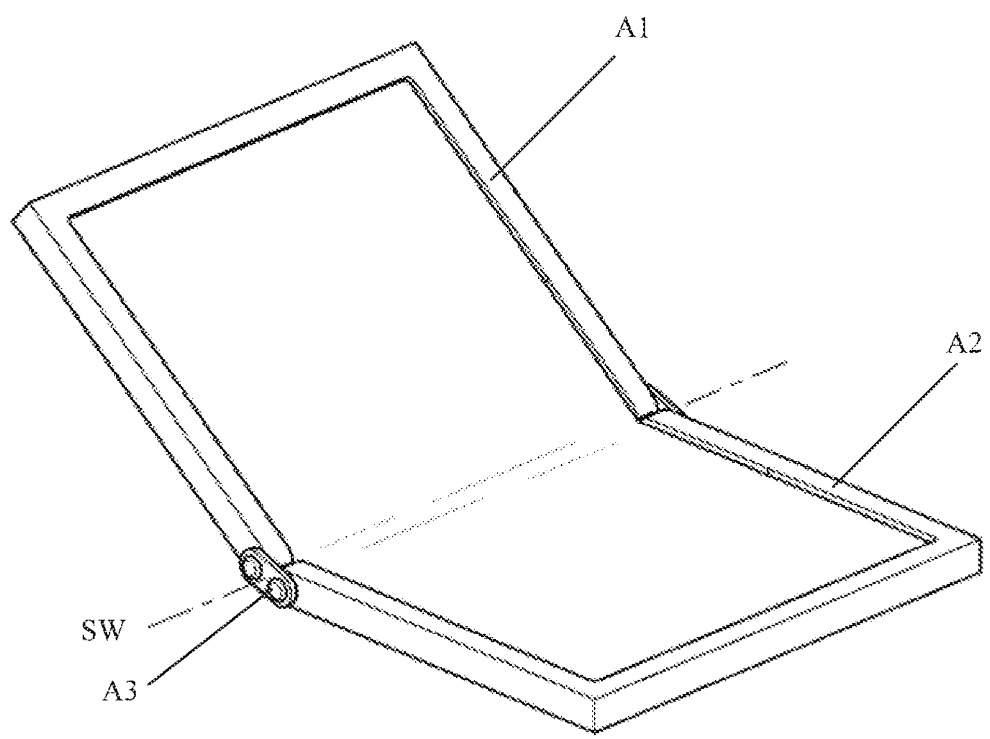
FIG. 1 is a schematic structural diagram of a bending apparatus in the conventional technology.

As described in the BACKGROUND, a conventional bending apparatus is bendable at only a single position. Reference is made to FIG. 1, which is a schematic structural diagram of a bending apparatus in conventional technology. The bending apparatus includes two supporting structures (A1 and A2 in FIG. 1) and a bending structure A3 rotatably connected to the two supporting structures. The two supporting structures are used for supporting a flexible display panel. In a case that the flexible display panel is to be bended, the supporting structure rotates about an axis SW where the supporting structure is connected to the bending structure A3, such that the flexible display panel is bent. As shown in FIG. 1, since the position of the bending structure A3 is fixed, the flexible display panel is bendable at only a single position, which cannot meet the requirement of users of bending the flexible display panel at multiple positions. In addition, since the flexible display panel is bendable at only the single fixed position, multiple bends at this position for a long time may reduce reliability of the flexible display panel due to concentrated stress.

In view of the above, a bending apparatus is provided according to the embodiment of the present disclosure. The bending apparatus includes a first supporting portion, a second supporting portion, and a bending portion. Each of the first supporting portion and the second supporting portion is formed by a retractable plate-shaped structure. The bending portion is rotatably connected to the first supporting portion and the second supporting portion. In application, the bending portion can be moved relative to the first supporting portion and the second supporting portion through retraction and extension of the first supporting portion and the second supporting portion. Therefore, a bendable portion of the bending apparatus can be changed, such that the bending apparatus is bendable at multiple positions.

Moreover, since the bending apparatus is bendable at multiple positions, the bendable position of the flexible display panel is not fixed. Therefore, stress concentration at the same position of the flexible display panel is avoided, thereby avoiding the problem that service life and reliability of the flexible display panel may be reduced due to multiple bends at the same position for a long time.

Embodiments of the present disclosure are described clearly and completely hereinafter in conjunction with drawings used in the embodiments of the present disclosure. Apparently, the described embodiments are only some embodiments of the present disclosure rather than all the embodiments.

Figure 2:
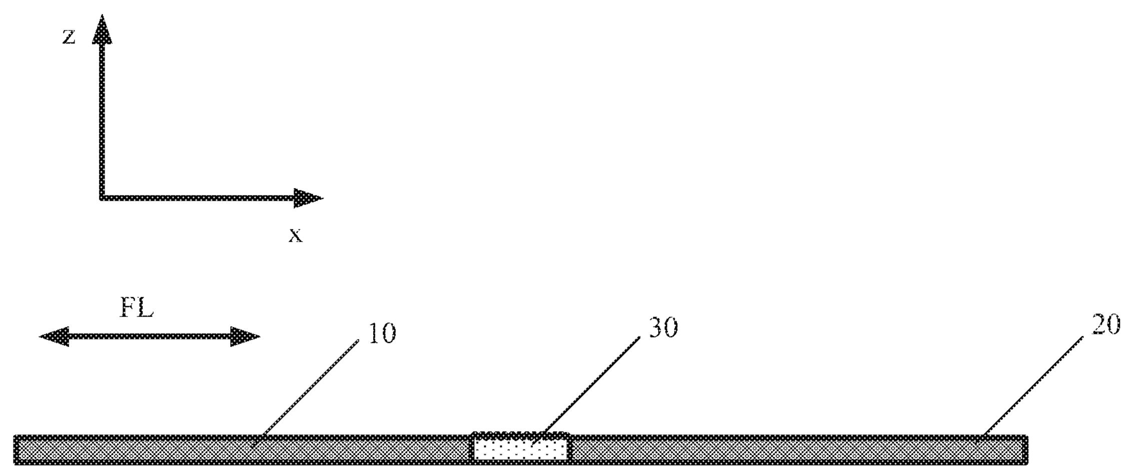
FIG. 2 is a cross-sectional view showing a structure of a bending apparatus according to an embodiment of the present disclosure.
Figure 3:
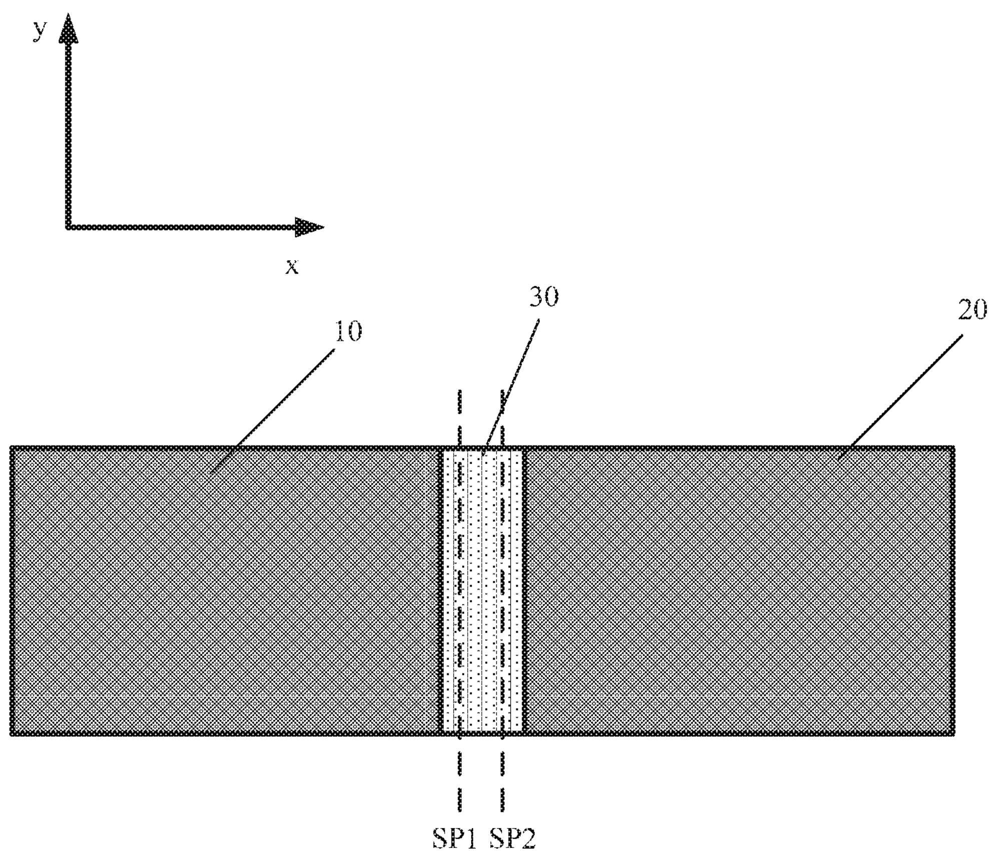
FIG. 3 is a top view showing a structure of the bending apparatus shown in FIG. 2.

A bending apparatus is provided according to an embodiment of the present disclosure, as shown in FIG. 2 and FIG. 3. FIG. 2 is a cross-sectional view showing a structure of the bending apparatus. FIG. 3 is a top view showing a structure of the bending apparatus. The bending apparatus includes a first supporting portion 10, a second supporting portion 20, and a bending portion 30.

Each of the first supporting portion 10 and the second supporting portion 20 is formed by a retractable plate-shaped structure.

The first supporting portion 10 is rotatably connected to the bending portion 30. In one embodiment, a rotation axis SP1 between the first supporting portion 10 and the bending portion 30 is parallel to an upper surface of the retractable plate-shaped structure of the first supporting portion 10.

The second supporting portion 20 is rotatably connected to the bending portion 30. A rotation axis SP2 between the second supporting portion 20 and the bending portion 30 is parallel to an upper surface of the retractable plate-shaped structure of the second supporting portion 20.

The Coordinate system shown in each of FIGS. 2 and 3 is a right-handed coordinate system, where a direction perpendicular to the upper surface of the first supporting portion 10 and the second supporting portion 20 and directed toward the flexible display panel serves as a positive direction of the z-axis. In the right-handed coordinate system, the x-y plane is parallel to a display plane of the flexible display panel.

In the embodiment, the retractable plate-shaped structure forming each of the first supporting portion 10 and the second supporting portion 20 is extended and retracted in a direction FL parallel to the x-axis. The rotation axis SP1 between the first supporting portion 10 and the bending portion 30, and the rotation axis SP2 between the second supporting portion 20 and the bending portion 30, are perpendicular to the x-axis and are located in the y-z plane.

Figure 4:
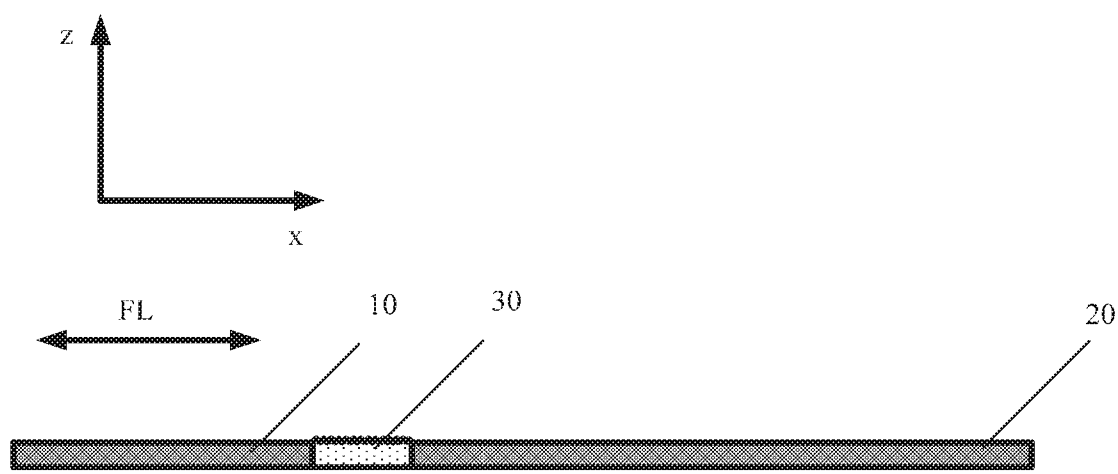
FIG. 4 is a cross-sectional view showing a structure of a bending apparatus according to another embodiment of the present disclosure.

In practical applications, an end of the first supporting portion 10 away from the bending portion 30 is fixedly connected to an end of the flexible display panel, and an end of the second supporting portion 20 away from the bending portion 30 is fixedly connected to another end of the flexible display panel, such that during extension and retraction of the first supporting portion 10 and the second supporting portion 20, a total supporting area provided by the first supporting portion 10, the second supporting portion 20, and the bending portion 30 in the x-z plane remains constant. Reference is made to FIG. 4, which is a cross-sectional view showing a structure of a bending apparatus. In the bending apparatus shown in FIG. 4, the first supporting portion 10 is retracted along the x-axis, and the second supporting portion 20 is extended along the x-axis. In this case, a position of the bending portion 30 relative to the first supporting portion 10 and the second supporting portion 20 is changed. That is, the coordinates of the bending portion 30 in the x-y plane are changed. Therefore, the position of the bending portion 30 of the bending apparatus is changed, such that the flexible display panel is bendable at different positions.

Moreover, since the bending apparatus is bendable at multiple positions, the bendable position of the flexible display panel is not fixed. Therefore, stress concentration at the same position of the flexible display panel is avoided, thereby avoiding the problem that service life and reliability of the flexible display panel may be reduced due to multiple bends at the same position for a long time.

It should be noted that, in the description of the above embodiments and subsequent embodiments of the present disclosure, only a bending apparatus including two supporting portions and one bending portion between the supporting portions is taken as an example. The present disclosure is not limited thereto. In other implementations, according to demands of the user and practical requirements on product design, the bending apparatus may include more supporting portions and bending portions. A bending supporting structure, which includes the supporting portion and the bending portion, may be connected to the flexible display panel in multiple manners, which can be set according to a practical situation. For example, in the bending apparatus, the flexible display panel may be fixedly connected to the bending supporting structure located under the flexible display panel at multiple positions, which is not limited in the present disclosure.

Figure 5:
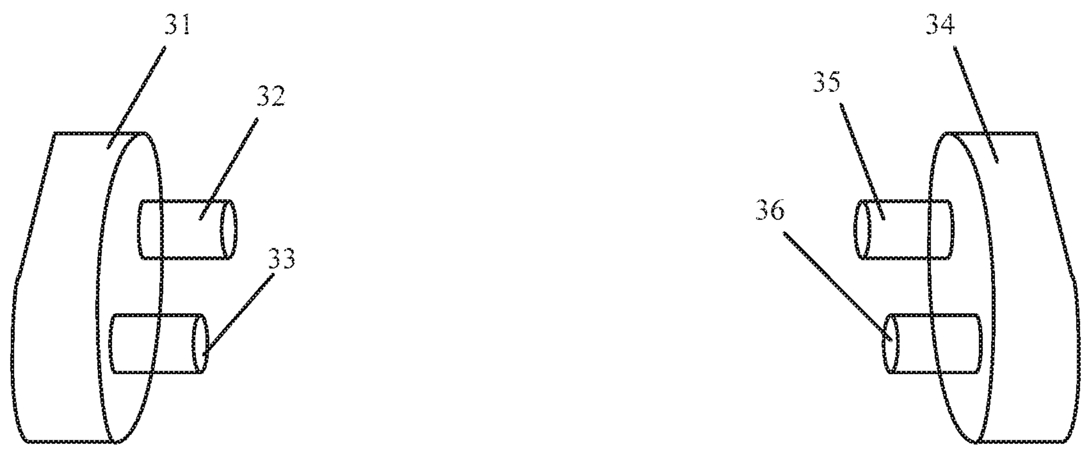
FIG. 5 is a schematic structural diagram of a bending portion according to an embodiment of the present disclosure.

Hereinafter, some structures of the bending portion 30 are described in the embodiments. Reference is made to FIG. 2 and FIG. 5. FIG. 5 is a schematic structural diagram of the bending portion 30. The bending portion 30 is a hinge-bending structure or a flexible connection structure. In the bending apparatus shown in FIG. 2, the bending portion 30 is the flexible connection structure. The flexible connection structure may be made of rubber, a bendable polymer, or the like. In one embodiment, in a case that the bending portion 30 is the flexible connection structure, the rotation axis SP1 between the first supporting portion 10 and the bending portion 30 may be a connection line between the first supporting portion 10 and the flexible connection structure, and the rotation axis SP2 between the second supporting portion 20 and the bending portion 30 may be a connection line between the second supporting portion 20 and the flexible connection structure. In one embodiment, the rotation axis SP1 between the first supporting portion 10 and the bending portion 30 may be located on a side of the connection line between the first supporting portion 10 and the flexible connection structure away from the first supporting portion 10, and the rotation axis SP2 between the second supporting portion 20 and the bending portion 30 may be located at a side of the connection line between the second supporting portion 20 and the flexible connection structure away from the second supporting portion 20. The rotation axis SP1 between the first supporting portion 10 and the bending portion 30 and the rotation axis SP2 between the second supporting portion 20 and the bending portion 30 may be a same axis or different axes, which is not limited in the present disclosure and may be set depending on practical design requirements on the bending apparatus.

Reference is made to FIG. 5. In a case that the bending portion 30 is a hinge-bending structure, the hinge-bending structure may include a first hinge member and a second hinge member. The first hinge member includes a first connecting portion 31, a first hinge shaft 32 and a second hinge shaft 33. The first hinge shaft 32 and the second hinge shaft 33 are arranged on a first surface of the first connecting portion 31. The second hinge member includes a second connecting portion 34, a third hinge shaft 35 and a fourth hinge shaft 36. The third hinge shaft 35 and the fourth hinge shaft 36 are arranged on a first surface of the second connecting portion 34. The first surface of the first connecting portion 31 is arranged in parallel with the first surface of the second connecting portion 34. The first hinge shaft 32 and the third hinge shaft 35 are configured to connect the first supporting portion 10. The second hinge shaft 33 and the fourth hinge shaft 36 are configured to connect the second supporting portion 20. A connecting line between the first hinge shaft 32 and the third hinge shaft 35 is the rotation axis SP1 between the first supporting portion 10 and the bending portion 30. A connecting line between the second hinge shaft 33 and the fourth hinge shaft 36 is the rotation axis SP2 between the second supporting portion 20 and the bending portion 30. It is appreciated that the embodiment shown in FIG. 5 only provides a specific configuration of a possible hinge-bending structure. In an embodiment of the present disclosure, the hinge-bending structure may include two hinge members, each including one hinge shaft. A connecting line between the hinge shafts of the two hinge members serves as the rotation axis between the first supporting portion 10 and the bending portion 30, and the rotation axis between the second supporting portion 20 and the bending portion 30. The first supporting portion 10 and the second supporting portion 20 are assembled on the two hinge shafts. Compared with the structure shown in FIG. 5, the number of the hinge shafts in this structure is reduced, but complexity of connection of the first supporting portion 10 and the second supporting portion 20 with the bending portion 30 is increased.

Based on the above embodiment, in an embodiment of the present disclosure, each of the first hinge shaft 32 and the third hinge shaft 35 is in an interference fit with the first supporting portion, and is rotatable relative to the first supporting portion, and each of the second hinge shaft 33 and the fourth hinge shaft 36 is in an interference fit with the second supporting portion, and is rotatable relative to the second supporting portion. In the embodiment, since each of the first hinge shaft 32 and the third hinge shaft 35 is in an interference fit with the first supporting portion, and is rotatable relative to the first supporting portion, and each of the second hinge shaft 33 and the fourth hinge shaft 36 is in an interference fit with the second supporting portion, and is rotatable relative to the second supporting portion, a certain frictional force is kept at the position where the first supporting portion 10 or the second supporting portion 20 is connected to the bending portion 30, such that the first supporting portion or the second supporting portion can be maintained at a position after being rotated by an angle about the rotation axis relative to the bending portion 30. Therefore, support for the flexible display panel at any angle is achieved without an additional auxiliary structure. A magnitude of interference between the first hinge shaft 32 or the third hinge shaft 35 and the first supporting portion, and a magnitude of interference between the second hinge shaft 33 or the fourth hinge shaft 36 and the second supporting portion may be set depending on a weight of the supported flexible display panel.

Hereinafter, some structures of the first supporting portion and the second supporting portion are described in embodiments. In these embodiments, referring to FIGS. 6 to 11, the retractable plate-shaped structure includes multiple plate-shaped structures that are successively connected in an end-to-end manner, and adjacent plate-shaped structures are slidable relative to each other. FIG. 6, FIG. 7, FIG. 9 and FIG. 10 are cross-sectional views showing the structure of the bending apparatus. FIG. 8 is an enlarged view of a dashed box K1 of FIG. 7. FIG. 11 is a top view of FIG. 10.

Figure 6:
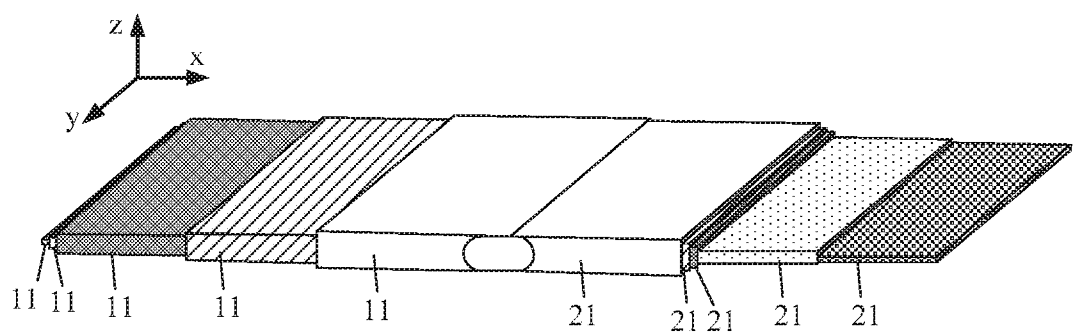
FIG. 6 is a schematic structural diagram of a bending apparatus according to another embodiment of the present disclosure.

Reference is made to FIG. 6. The first supporting portion includes multiple first supporting plates 11. The multiple first supporting plates 11 are successively connected in a retractable manner, such that cross-sectional areas of the multiple first supporting plates 11 are gradually reduced. The first supporting plate 11 having the greatest cross-sectional area is configured to connect the bending portion. The first supporting plate 11 having the smallest cross-sectional area located at an end of the first supporting portion away from the bending portion is fixedly connected to the flexible display panel.

The second supporting portion includes multiple second supporting plates 21. The multiple second supporting plates 21 are successively connected in a retractable manner, such that cross-sectional areas of the multiple second supporting plates 21 are gradually reduced. The second supporting plate 21 having the greatest cross-sectional area is configured to connect the bending portion. The second supporting plate 21 having the smallest cross-sectional area located at an end of the second supporting portion away from the bending portion is fixedly connected to the flexible display panel.

A cross section of the first supporting portion and a cross section of the second supporting portion are both perpendicular to the upper surface of the retractable plate-shaped structure. The cross section of the first supporting portion and the cross section of the second supporting portion are both parallel to the rotation axis between the first supporting portion and the bending portion.

In the embodiment shown in FIG. 6, the cross section of the first supporting portion and the cross section of the second supporting portion are both parallel to the y-z plane. Extension or retraction of the first supporting portion or the second supporting portion along the x-axis can be achieved by pulling or pushing the multiple first supporting plates 11 or the multiple second supporting plates 21, which are connected in the retractable manner.

Figure 12:
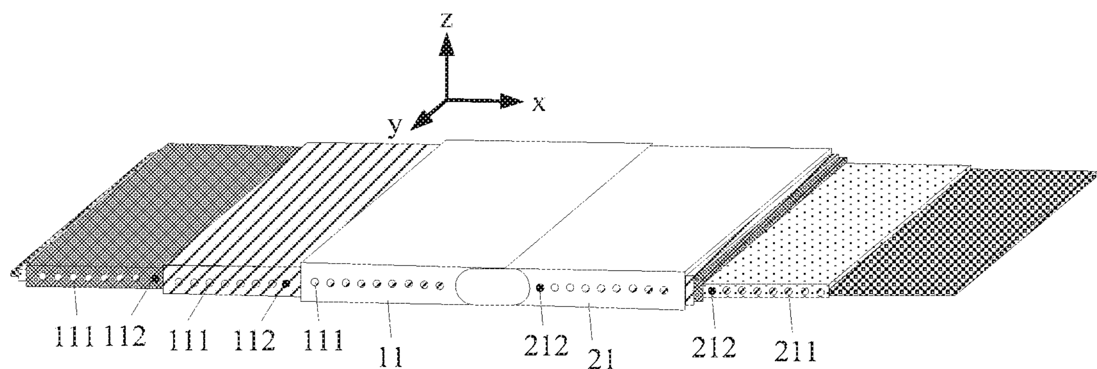
FIG. 12 is a schematic structural diagram of a bending apparatus according to another embodiment of the present disclosure.

In order to fix a first supporting plate 11 or a second supporting plate 21 at a position, referring to FIG. 12, each of the multiple first supporting plates 11 further includes multiple first positioning holes 111 located on a sidewall of the first supporting plate 11.

Each of the multiple first supporting plates 11, except for the first supporting plate 11 having the greatest cross-sectional area, further includes a first positioning structure 112 located on the sidewall of the first supporting plate 11. The first positioning structure 112 is configured to be engaged with one of the multiple first positioning holes 111 for positioning.

Each of the second supporting plate 21 further includes multiple second positioning holes 211 located on a side wall of the second supporting plate 21.

Each of the multiple second supporting plates 21, except for the second supporting plate 21 having the greatest cross-sectional area, further includes a second positioning structure 212 located on the sidewall of the second supporting plate 21. The second positioning structure 212 is configured to be engaged with one of the multiple second positioning holes 211 for positioning.

In the embodiment shown in FIG. 12, in a case that the first positioning structure 112 on a first supporting plate 11 which is pulled or pushed with respect to an adjacent first supporting plate 11 is engaged with the first positioning hole 111 of the adjacent first supporting plate 11, a relative position between the first supporting plate 11 and the adjacent first supporting plate 11 is fixed. Therefore, relative sliding between adjacent first supporting plates 11 is avoided when extension or retraction of the first supporting portion is not required. Moreover, in a case that the first supporting portion is to be extended or retracted, the engagement between the first positioning structure 112 and the first positioning hole 111 can be released.

Similarly, in a case that the second positioning structure 212 on a second supporting plate 21 which is pulled or pushed with respect to an adjacent second supporting plate 21 is engaged with the second positioning hole 211 of the adjacent second supporting plate 21, a relative position between the second supporting plate 21 and the adjacent second supporting plate 21 is fixed. Therefore, relative sliding between adjacent second supporting plates 21 is avoided when extension or retraction of the second supporting portion is not required. Moreover, in a case that the second supporting portion is to be extended or retracted, the engagement between the second positioning structure 212 and the second positioning hole 211 can be released.

In one embodiment, the first positioning structure 112 may be a spring pin or a positioning protrusion, and the second positioning structure 212 may be a spring pin or a positioning protrusion. In a case that the first positioning structure 112 and the second positioning structure 212 are both spring pins, the spring pins can be extended or retracted through a spring. Therefore, the engagement between the positioning structure and the positioning hole can be more easily released as compared with the positioning protrusion.

Figure 7:
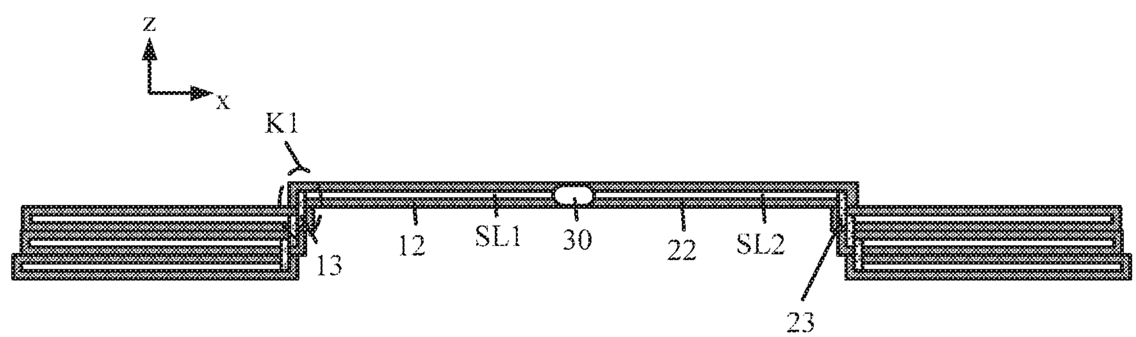
FIG. 7 is a cross-sectional view showing a structure of a bending apparatus according to another embodiment of the present disclosure.
Figure 8:
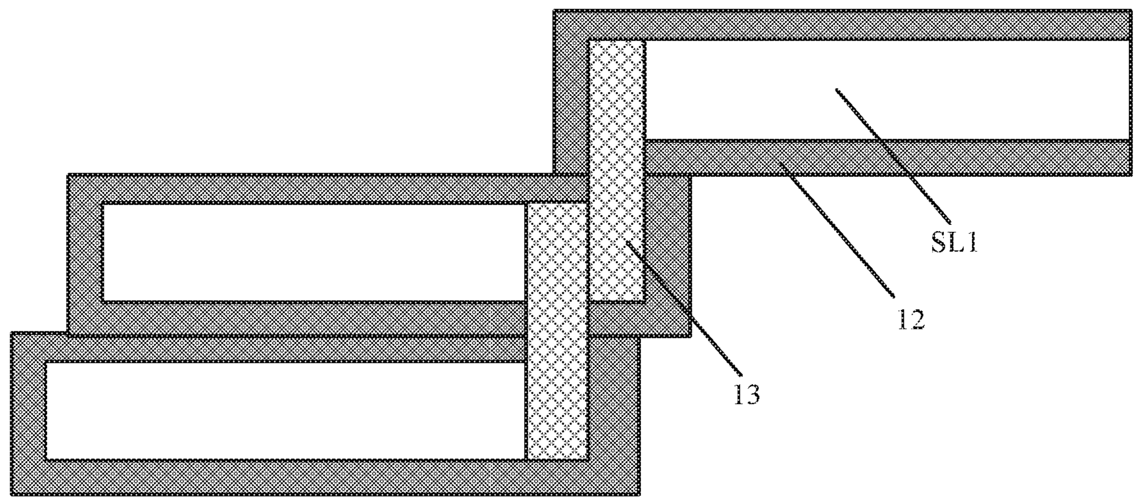
FIG. 8 is an enlarged view of a dashed box K1 in FIG. 7.
Figure 9:
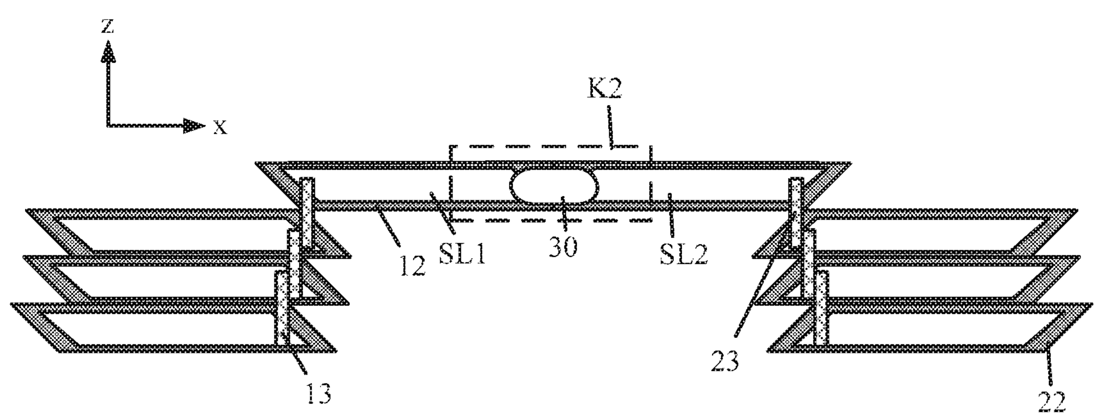
FIG. 9 is a cross-sectional view showing a structure of a bending apparatus according to an embodiment of the present disclosure.

Reference is made to FIG. 7, FIG. 8, and FIG. 9. In these embodiments, the first supporting portion includes multiple third supporting plates 12, and multiple first connecting blocks 13 connecting adjacent third supporting plates 12.

Each of the multiple third supporting plates 12 includes a first slide rail SL1 located on a first sidewall of the third supporting plate 12. The first slide rail SL extends in the first direction.

Two ends of each of the multiple first connecting blocks 13 are respectively embedded into first slide rails SL1 of third supporting plates 12 adjacent to the first connecting block 13, and are movable in the first slide rails SL1 in the direction in which the first slide rails SL1 extend.

The second supporting portion includes multiple fourth supporting plates 22, and multiple second connecting blocks 23 connecting adjacent third supporting plates 22.

Each of the multiple fourth supporting plates 22 includes a second slide rail SL2 located on a first sidewall of the fourth supporting plate 22. The second slide rail SL2 extends in the first direction.

Two ends of each of the multiple second connecting blocks 23 are respectively embedded into second slide rails SL2 of fourth supporting plates 22 adjacent to the second connecting block 23, and are movable in the second slide rails SL2 in the direction in which the second slide rails SL2 extend.

Cross-sectional views of two possible structures of the third supporting plates 12 and the fourth supporting plates 22 are provided according to the embodiments shown in FIGS. 7, 8 and 9. In the embodiment shown in FIGS. 7 and 8, a second sidewall of the third supporting plate 12 is parallel to the first direction, and faces the adjacent third supporting plate 12 if the second sidewall rotates counterclockwise by a predetermined angle. A second sidewall of the fourth supporting plate 22 is parallel to the first direction, and faces the adjacent fourth supporting plate 22 if the second sidewall rotates clockwise by a predetermined angle. The predetermined angle is 90°. In this structure, extension and retraction of the first supporting portion are achieved by only sliding of the third supporting plate 12 along the first slide rail SL1, the operation is simple and requires less effort to practice.

In the embodiment shown in FIG. 9, the second sidewall of the third supporting plate 12 is parallel to the first direction and faces the adjacent third supporting plate 12 if the second sidewall rotates counterclockwise by the predetermined angle. The second sidewall of the fourth supporting plate 22 is parallel to the first direction, and faces the adjacent fourth supporting plate 22 if the second sidewall rotates clockwise by the predetermined angle. The predetermined angle is less than 90°. In this embodiment, the first connecting block 13 is further configured to rotate about an end of the first connecting block 13 connected to the third supporting plate 12. The second connecting block 23 is further configured to rotate about an end of the second connecting block 23 connected to the fourth supporting plate 22. In this structure, the first connecting block 13 and the second connecting block 23 rotates, so that the upper surfaces of adjacent third supporting plates 12 or adjacent fourth supporting plates 22 are in a same plane for providing better support for the flexible display panel. In a case that the first supporting portion or the second supporting portion is to be extended or retracted, the first connecting block 13 or the second connecting block 23 is rotated, so that the upper surfaces of adjacent third supporting plates 12 or adjacent fourth supporting plates 22 are in different planes, and then the first connecting block 13 or the second connecting block 23 slides along the first slide rail SL1 or the second slide rail SL2, such that the first supporting portion or the second supporting portion is extended or retracted.

Figure 13:
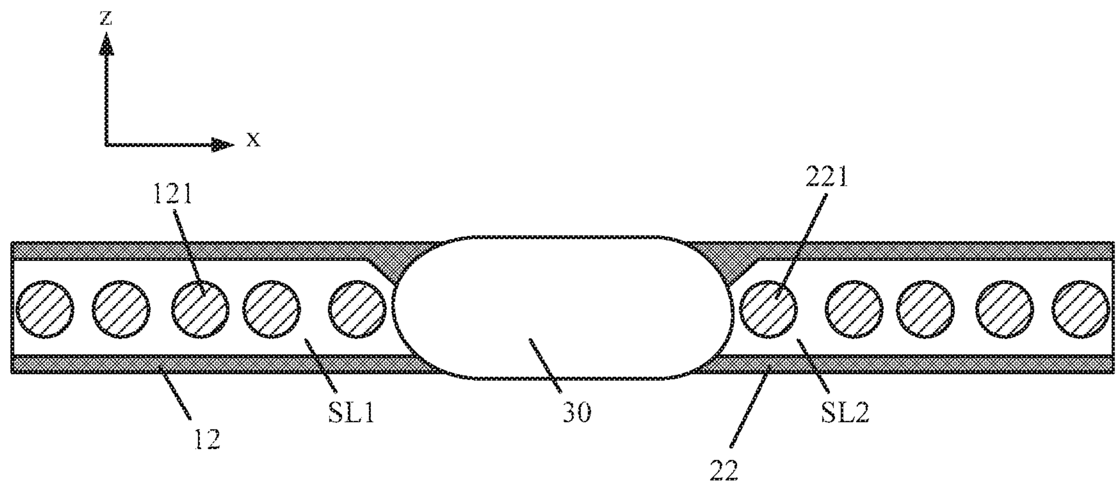
FIG. 13 is an enlarged view of a dashed box K2 in FIG. 9.

Similarly, in order to fix a first connecting block 13 or a second connecting block 23 at a position, referring to FIG. 13, which is an enlarged view of a dashed box K2 in FIG. 9, the bending apparatus further includes a third positioning structure arranged on each of the multiple first connecting blocks 13, and a fourth positioning structure arranged on each of the multiple second connecting block 23.

Each of the third supporting plate 12 further includes multiple first positioning grooves 121 located in the first slide rail SL1. The third positioning structure is configured to be engaged with one of the multiple first positioning grooves 121 for positioning.

Each of the fourth supporting plate 22 further includes multiple second positioning grooves 221 located in the second slide rail SL2. The fourth positioning structure is configured to be engaged with one of the multiple second positioning grooves 221 for positioning.

In the embodiment shown in FIG. 13, in a case that a third positioning structure is engaged with one of the first positioning grooves 121 on a third supporting plate 12 when the first connecting block 13 slides in the first slide rail SL, a position of the third supporting plate 12 relative to an adjacent third supporting plate 12 is fixed. Therefore, the relative sliding between adjacent third supporting plates 12 is avoided in a case that the extension or retraction of the first supporting portion is not required. In a case that the first supporting portion is to be extended or retracted, engagement between the third positioning structure and the first positioning groove 121 can be released.

Similarly, in a case that a fourth positioning structure is engaged with one of the second positioning grooves 221 on a forth supporting plate 22 when the second connecting block 23 slides in the second slide rail SL2, a position of the fourth supporting plate 22 relative to an adjacent fourth supporting plate 22 is fixed. Therefore, the relative sliding between adjacent fourth supporting plates 22 is avoided in a case that the extension or retraction of the second supporting portion is not required. In a case that the second supporting portion is to be extended or retracted, engagement between the fourth positioning structure and the second positioning groove 221 can be released.

In an embodiment, the third positioning structure may be a spring pin or a positioning protrusion, and the fourth positioning structure may be a spring pin or a positioning protrusion. In a case that the third positioning structure and the fourth positioning structure are both the spring pins, the spring pins can be extended or retracted through a spring. Therefore, the engagement between the positioning structure and the positioning groove can be more easily released as compared with the positioning protrusion.

Figure 10:
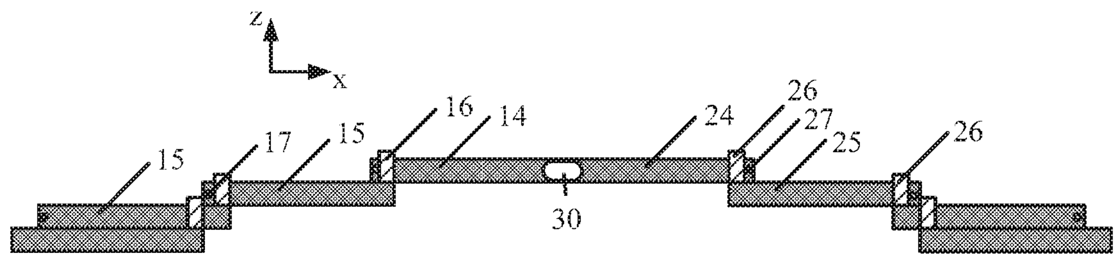
FIG. 10 is a cross-sectional view showing a structure of a bending apparatus according to another embodiment of the present disclosure.
Figure 11:
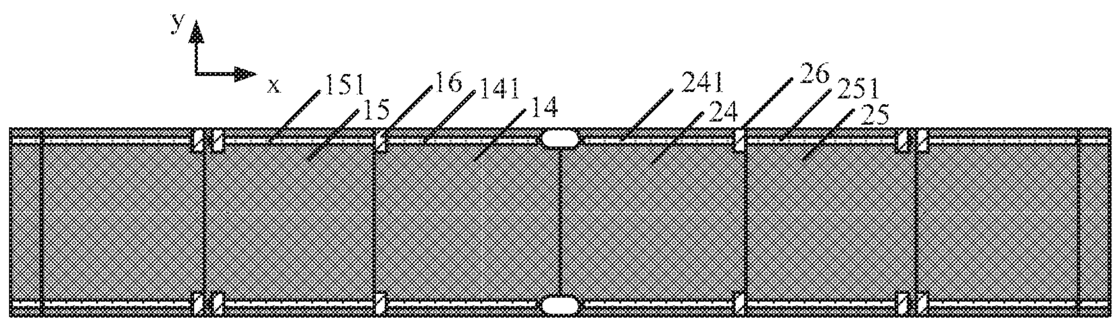
FIG. 11 is a top view showing a structure of the bending apparatus shown in FIG. 10.

Reference is made to FIG. 10 and FIG. 11. In the embodiments shown in FIG. 10 and FIG. 11, the first supporting portion includes a fifth connecting portion 14 and multiple sixth connecting portions 15.

A surface of the fifth connecting portion 14 is provided with two first slots 141 extending in the first direction. An end of the fifth connecting portion 14 is configured to connect the bending portion 30.

Each of the sixth connecting portion 15 includes two second slots 151 extending in the first direction and two first latching structures 16. The two second slots 151 are arranged on a surface of the sixth connecting portion 15. The two first latching structures are arranged on an end of a first side surface of the sixth connecting portion 15 close to the bending portion 30. The first side surface of the sixth connecting portion 15 is parallel to the first direction.

The two first latching structures 16 are configured to be engaged with the two second slots 151 of the sixth connection portion 15 or the two first slots 141 of the fifth connecting portion 14 to achieve slidable connection with the sixth connecting portion 15 or the fifth connecting portion 14.

The second supporting portion includes a seventh connecting portion 24 and multiple eighth connecting portions 25.

A surface of the seventh connecting portion 24 is provided with two third slots 241 extending in the first direction. An end of the seventh connecting portion 24 is configured to connect the bending portion 30.

Each of the multiple eighth connecting portion 25 includes two fourth slots 251 extending in the first direction and two second latching structures 26. The two fourth slots 251 are arranged on a surface of the eighth connecting portion 25. The two second latching structures are arranged on an end of a first side surface of the eighth connecting portion 25 close to the bending portion 30. The first side surface of the eighth connecting portion 25 is parallel to the first direction.

The two second latching structures 26 are configured to be engaged with the two fourth slots 251 of an adjacent eighth connection portion 55 or the two third slots 241 of the seventh connecting portion 24 to achieve slidable connection with the eighth connecting portion 25 or the seventh connecting portion 24.

In the embodiment, the first direction is parallel to the x-axis. The first side surface of the sixth connecting portion 15 is parallel to the x-z plane. The first side surface of the eighth connecting portion 25 is parallel to the x-z plane.

In order to prevent the first latching structure 16 of the sixth connecting portion 15 from slipping out of the first slot 141 or the second slot 151, FIG. 10 illustrates a first limiting block 17 located on a side surface of the fifth connecting portion 14 or the sixth connecting portion 16 for limiting a position of the first latching structure 16, so as to prevent the first latching structure 16 from slipping out of the first slot 141 or the second slot 151. Similarly, in order to prevent the second latching structure 26 from slipping out of the third slot 241 or the fourth slot 251, FIG. 10 illustrates a second limiting block 27 located on a side surface of the seventh connecting portion 24 or the eighth connecting portion 25 for limiting a position of the second latching structure 26, so as to prevent the second latching structure 26 from slipping out of the third slot or the fourth slot.

Figure 14:
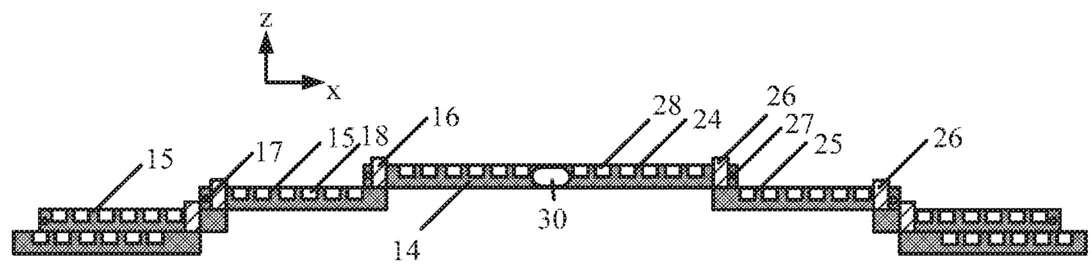
FIG. 14 is a cross-sectional view showing a structure of a bending apparatus according to an embodiment of the present disclosure.

Reference is made to FIG. 14, which is a cross-sectional view of a bending apparatus. In order to fix a first latching structure 16 or a second latching structure 26 at a certain position, according to an embodiment of the present disclosure, each of the fifth connecting portion 14 and the multiple sixth connecting portions 15 further includes multiple third positioning grooves 18 arranged on the surface of the fifth connecting portion 14 or the sixth connecting portion 15. The third positioning groove 18 is configured to be engaged with the first latching structures 16 of an adjacent sixth connecting portion 15 for positioning.

Each of the seventh connecting portion 24 and the multiple eighth connecting portions 25 further includes multiple fourth positioning grooves 28 arranged on the surface of the seventh connecting portion 24 or the eighth connecting portion 25. The fourth positioning groove 28 is configured to be engaged with the second latching structures 26 of an adjacent eighth connecting portion 25 for positioning.

In the embodiment shown in FIG. 14, in a case that a first latching structure 16 is engaged with the third positioning groove 18, a position of the first latching structure 16 relative to the adjacent connecting portion can be fixed. The relative sliding between adjacent connecting portions is prevented when extension or retraction of the first supporting portion is not required. Moreover, in a case that the first supporting portion is to be extended or retracted, the engagement between the first latching structure 16 and the third positioning groove 18 can be released.

Similarly, in a case that a second latching structure 26 is engaged with the fourth positioning groove 28, a position of the second latching structure 26 relative to the adjacent connecting portion can be fixed. The relative sliding between adjacent connecting portions is prevented when extension or retraction of the second supporting portion is not required. Moreover, in a case that the second supporting portion is to be extended or retracted, the engagement between the second latching structure 26 and the fourth positioning groove 28 can be released.

Figure 15:
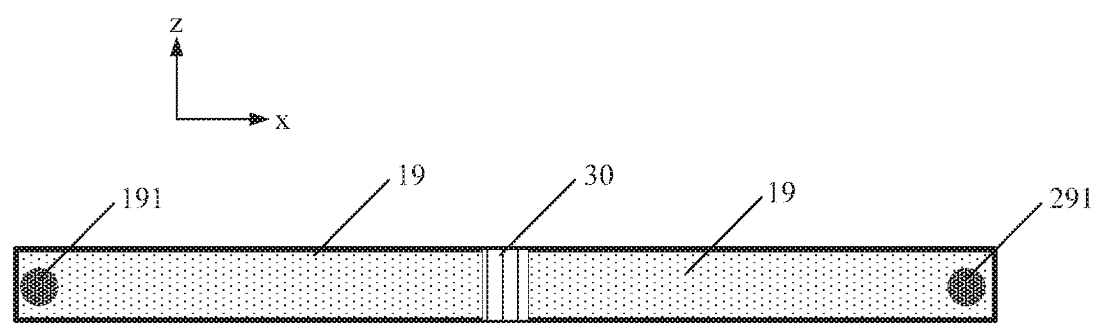
FIG. 15 is a cross-sectional view showing a structure of a bending apparatus according to an embodiment of the present disclosure.

On the basis of the above embodiments, another possible structure of the first supporting portion and the second supporting portion is provided according to an embodiment of the present disclosure, as shown in FIG. 15. FIG. 15 is a cross-sectional view showing a structure of a bending apparatus. The retractable plate-shaped structure is a sealed chamber.

The sealed chamber is located in a flexible film structure having a sealed cavity, a first vent 191 and a second vent 291. The bending portion 30 is arranged in the flexible film structure, the sealed cavity is separated into two sealed chambers 19 through the bending portion 30. When filled with gas, the sealed chamber 19 is a rigid plate-shaped supporting structure.

The first vent 191 is arranged at a side of the first supporting portion away from the bending portion 30. The second vent 291 is arranged at a side of the second supporting portion away from the bending portion 30.

In the embodiment shown in FIG. 15, the bending portion 30 is arranged in the flexible film structure, and is moved due to an air pressure difference between the first supporting portion and the second supporting portion. For example, in a case that the bending portion 30 is to move in a positive direction of the x-axis, the sealed chamber 19 of the first supporting portion may be inflated via the first vent 191, such that the pressure in the sealed chamber 19 of the first supporting portion is greater than the pressure in the sealed chamber 19 of the second supporting portion. A force in the positive direction of the x-axis is generated on a surface of the bending portion 30 facing the first supporting portion due to the pressure difference, such that the bending portion 30 is moved.

Figure 16:
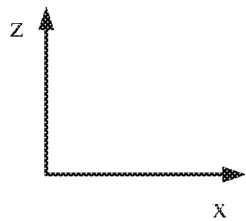
FIG. 16 is a cross-sectional view showing a structure of a display device according to an embodiment of the present disclosure.

Correspondingly, a display device is further provided according to an embodiment of the present disclosure, as shown in FIG. 16. FIG. 16 is a cross-sectional view showing a structure of the display device. The display device includes: a flexible display panel 200 and a bending apparatus 100. The bending apparatus 100 is the bending apparatus 100 according to any of the aforementioned embodiments. The bending apparatus 100 includes a first supporting portion, a second supporting portion and a bending portion.

An end of the first supporting portion away from the bending portion is fixedly connected to the flexible display panel 200. An end of the second supporting portion away from the bending portion is fixedly connected to the flexible display panel 200.

Similarly, the coordinate system in FIG. 16 is a right-handed coordinate system established with a direction pointing from an upper surface of the first supporting portion of the bending apparatus 100 toward the flexible display panel 200 serving as a positive direction of the z-axis. In the right-hand coordinate system, the x-y plane is parallel to a display plane of the flexible display panel 200.

The end of the first supporting portion away from the bending portion is fixedly connected to an end of the flexible display panel 200. The end of the second supporting portion away from the bending portion is fixedly connected to the other end of the flexible display panel 200, such that during the extension and retraction of the first supporting portion and the second supporting portion, a total supporting area of the first supporting portion, the second supporting portion and the bending portion in the x-z plane remains constant.

Figure 17:
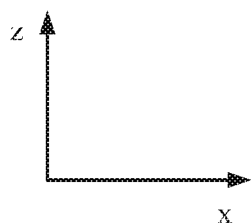
FIG. 17 is a cross-sectional view showing a structure of a display device according to another embodiment of the present disclosure.

Reference is made to FIG. 17, which is a cross-sectional view showing a structure of the display device. In FIG. 17, the first supporting portion is retracted along the x-axis, and the second supporting portion is extended along the x-axis. In this case, a position of the bending portion relative to the first supporting portion and the second supporting portion is changed. Namely, coordinates of the bending portion in the x-y plane are changed. Therefore, a bendable position of the bending apparatus 100 is changed, such that the flexible display panel 200 is bendable at different positions.

Moreover, since the bending apparatus 100 is bendable at multiple positions, the stress concentration at the same position of the flexible display panel 200 is avoided, thereby avoiding the problem that service life and reliability of the flexible display panel 200 may be reduced due to multiple bends at the same position for a long time.

Further, since the first supporting portion and the second supporting portion of the bending apparatus can be extended or retracted, the change in the length of the first supporting portion or the second supporting portion which is bended can be compensated, such that stress received by the flexible display panel when the display device is bended is reduced, and the reliability and durability of the flexible display panel are improved.

Figure 18:
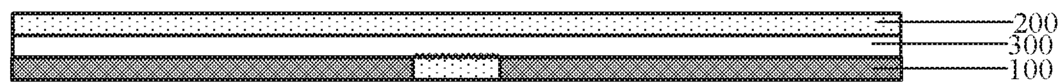
FIG. 18 is a cross-sectional view showing a structure of a display device according to another embodiment of the present disclosure.

Since the first supporting portion and the second supporting portion of the bending apparatus 100 can be extended or retracted, the upper surface of the first supporting portion or the second supporting portion may not be flat when the first supporting portion or the second supporting portion is bent. Therefore, according to some embodiments of the present disclosure, the display device further includes a supporting member 300. Reference is made to FIG. 18, which is a cross-sectional view showing a structure of a display device.

The supporting member 300 is arranged between the flexible display panel 200 and the bending apparatus including the first supporting portion, the second supporting portion and the bending portion.

The supporting member 300 is required to be resistant to repeated bending. Therefore, the supporting member 300 may be, for example, a sheet-like structure made of a steel sheet or a polymer material. Due to the supporting member 300, the flexible display panel 200 can be provided with a relatively flat supporting surface in a case that the first supporting portion or the second supporting portion is not flat due to the extension or retraction.

Figure 19:
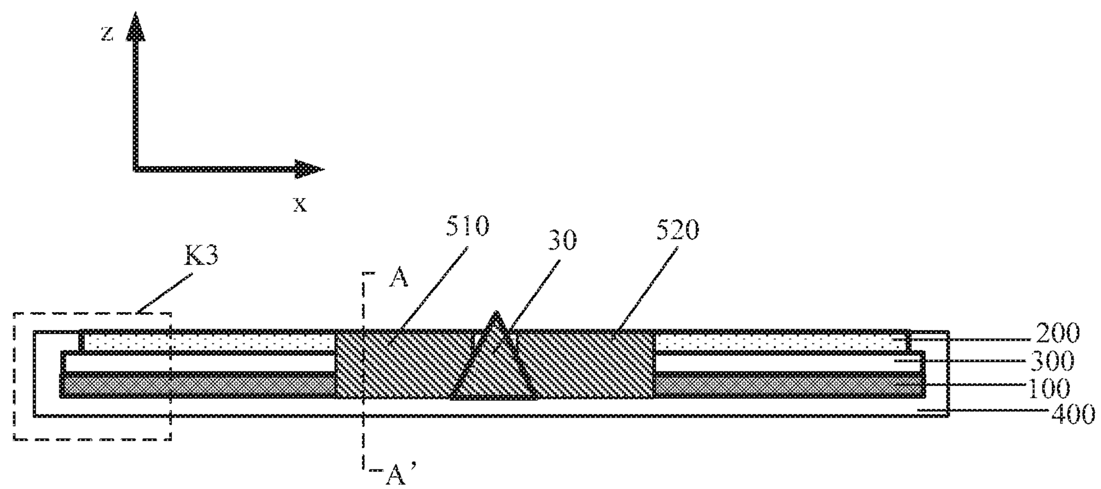
FIG. 19 is a cross-sectional view showing a structure of a display device according to another embodiment of the present disclosure.
Figure 20:
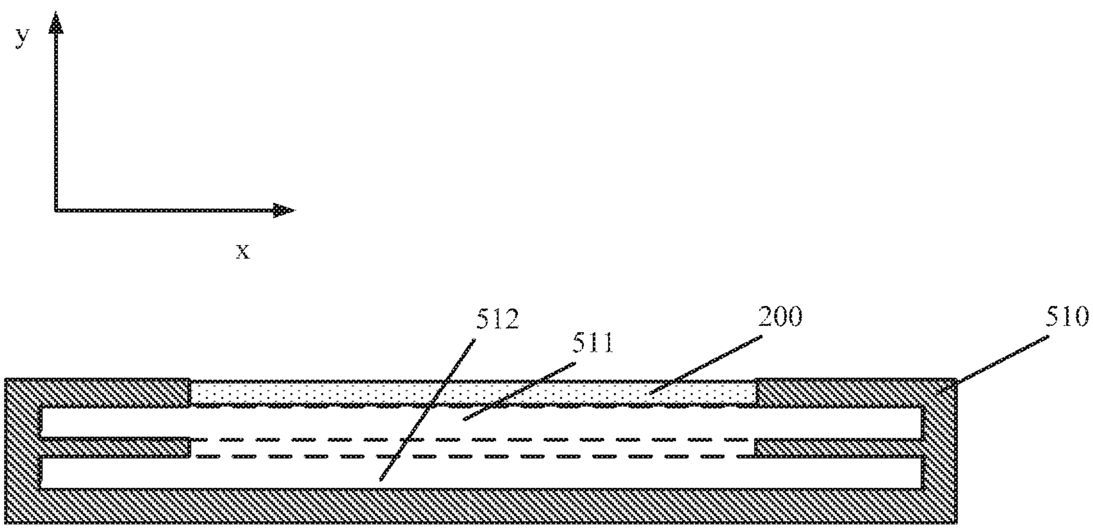
FIG. 20 is a cross-sectional view taken along a line AA' in FIG. 19.
Figure 21:
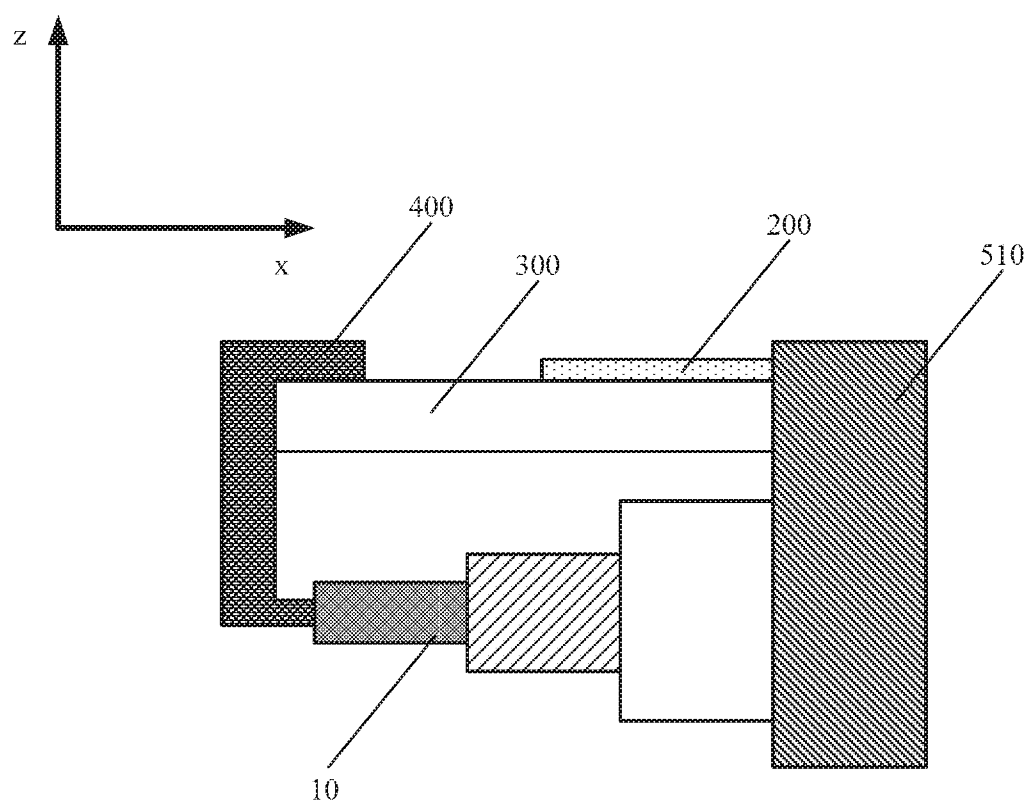
FIG. 21 is an enlarged view of a dashed box K3 in FIG. 19.

Reference is made to FIGS. 19, 20 and 21. FIG. 19 is a cross-sectional view showing a structure of a display device. FIG. 20 is a cross-sectional view along line AA' in FIG. 19. FIG. 21 is an enlarged view of a dashed box K3 in FIG. 19. Based on the above embodiment, according to another embodiment of the present disclosure, the bending apparatus 100 further includes an auxiliary apparatus and a package structure 400.

The package structure 400 includes a holding cavity and a display opening. A bottom surface of the holding cavity is configured to arrange the first supporting portion 10 and the second supporting portion. Two ends of the supporting member 300 are respectively fixedly connected to the package structure 400 at two ends of the display opening in the first direction.

The flexible display panel 200 is arranged on a side of the supporting member 300 away from the first supporting portion 10. The flexible display panel 200 is exposed by the display opening.

The auxiliary apparatus includes a first auxiliary member 510 and a second auxiliary member 520. The first auxiliary member 510 includes a first connecting hole, a first limiting slot 511 and a second limiting slot 512. The second auxiliary member 520 includes a second connecting hole, a third limiting slot and a fourth limiting slot. The first connecting hole is configured to connect the bending portion. The second connecting hole is configured to connect the bending portion. Two sides of the supporting member 300 are arranged in the first limiting slot 511 and the third limiting slot. A side of the first supporting portion is arranged in the second limiting slot 512. A side of the second supporting portion is arranged in the fourth limiting slot.

FIG. 20 is a cross-sectional view showing the structure of only the first auxiliary member 510. The cross-sectional structure of the second auxiliary member 520 is the same as that of the first auxiliary member 510, and is not repeatedly described herein.

The first auxiliary member 510 and the second auxiliary member 520 are configured to assist in bending of the first supporting portion 10 and the second supporting portion, so as to simplify bending actions of the first supporting portion 10 and the second supporting portion. The package structure 400 is configured to package the bending apparatus 100, the supporting member 300 and the flexible display panel 200 integrally, to prevent dust, moisture and the like from entering the display device, and to make the display device aesthetically pleasing.

Figures 22, 23:
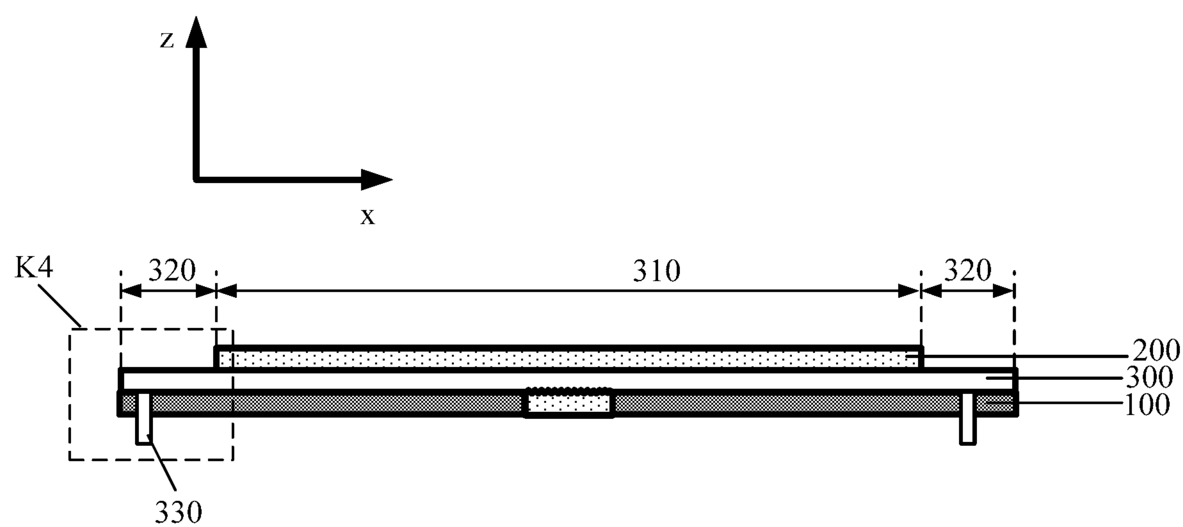
FIG. 22 is a schematic structural diagram of a bending portion according to another embodiment of the present disclosure.
FIG. 23 is a cross-sectional view showing a structure of a display device according to an embodiment of the present disclosure.

Reference is made to FIG. 22, which is a schematic structural diagram of a bending portion. On the basis of the aforementioned embodiments, according to an embodiment of the present disclosure, the display device further includes a first roller 37 and a second roller 38.

The first roller 37 and the second roller 38 are arranged on the bending portion. The first roller 37 and the second roller 38 are rollable on a surface of the supporting member 300 away from the first supporting portion.

The first roller 37 and the second roller 38 can assist in relative sliding between the bending portion and the first supporting portion, and between the bending portion and the second supporting portion, and limit the first supporting portion and the second supporting portion, so as to prevent a relative movement between the first supporting portion and the second supporting portion along the z-axis.

Figure 24:
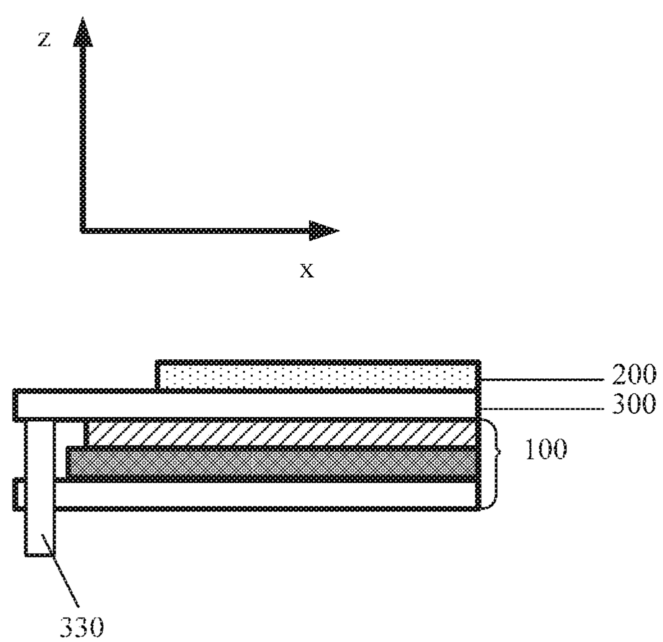
FIG. 24 is an enlarged view of a dashed box K4 in FIG. 23.

Reference is made to FIG. 23, which is a cross-sectional view showing a structure of the display device. FIG. 24 is an enlarged view of a dashed box K4 in FIG. 23. On the basis of the above embodiment, in another embodiment of the present disclosure, the supporting member 300 includes a first region 310 and a second region 320 surrounding the first region 310. The first region 310 is fixedly connected to the flexible display panel 200.

The bending apparatus 100 further includes four supporting posts 330 fixedly connected to the supporting member 300. An orthographic projection of the supporting posts 330 on the supporting member 300 is located within the second region 320.

The first supporting portion further includes two first sliding holes. The two first sliding holes are engaged with two of the four supporting posts 330, so that the retractable plate-shaped structure of the first supporting portion is slidable along the supporting post 330.

The second supporting portion further includes two second sliding holes. The two second sliding holes are engaged with two of the four supporting posts 330, so that the retractable plate-shaped structure of the second supporting portion is slidable along the supporting post 330.

The supporting post 330 provides a space for extension and retraction movements of the first supporting portion and the second supporting portion. The slidable connection between the supporting post 330 and the sliding hole makes the extension and retraction movements of the supporting portions smooth.

It should be noted that, in the aforementioned embodiments of the present disclosure, the bending apparatus including two supporting portions and one bending portion between the supporting portions is taken as an example. The present disclosure is not limited thereto. In other implementations, based on requirements of the user and practical product design requirements, the bending apparatus may include more supporting portions and bending portions. A bending supporting structure, which includes the supporting portion and the bending portion, may be connected to the flexible display panel in multiple manners, which can be set according to a practical situation. For example, in the bending apparatus, the flexible display panel may be fixedly connected to the bending supporting structure located under the flexible display panel at multiple positions, which is not limited in the present disclosure.

In summary, the bending apparatus and the display device are provided according to the embodiments of the present disclosure. The bending apparatus includes the first supporting portion and the second supporting portion which are formed by the retractable plate-shaped structures, and the bending portion rotatably connected to the first supporting portion and the second supporting portion. In application, the position of the bending portion relative to the first supporting portion and the second supporting portion is movable through the retractable first supporting portion and the retractable second supporting portion. Therefore, the bendable portion of the bending apparatus can be changed, such that the bending apparatus is bendable at multiple positions.

Moreover, since the bending apparatus is bendable at multiple positions, the bendable position of the flexible display panel is not fixed, thereby avoiding the problem that service life and reliability of the flexible display panel may be reduced due to multiple bends at a same position for a long time.

The invention claimed is:

1. A bending apparatus, comprising a first supporting portion, a second supporting portion and a bending portion, wherein:

each of the first supporting portion and the second supporting portion is formed by a retractable plate-shaped structure, the first supporting portion is rotatably connected to the bending portion, and the second supporting portion is rotatably connected to the bending portion, wherein the retractable plate-shaped structure comprises a plurality of plate-shaped structures which are successively connected in an end-to-end manner, and adjacent plate-shaped structures are slidable relative to each other, wherein the first supporting portion comprises a plurality of first supporting plates, the plurality of first supporting plates are successively connected in a retractable manner, such that cross-sectional areas of the plurality of first supporting plates are gradually reduced, one of the plurality of first supporting plates having the greatest cross-sectional area is configured to connect the bending portion, one of the plurality of first supporting plates having the smallest cross-sectional area located at an end of the first supporting portion away from the bending portion is configured to be fixedly connected to a flexible display panel, the second supporting portion comprises a plurality of second supporting plates, the plurality of second supporting plates are successively connected in a retractable manner, such that cross-sectional areas of the plurality of second supporting plates are gradually reduced, one of the plurality of second supporting plates having the greatest cross-sectional area is configured to connect the bending portion, one of the plurality of second supporting plates having the smallest cross-sectional area located at an end of the second supporting portion away from the bending portion is configured to be fixedly connected to the flexible display panel, and a cross section of each of the plurality first supporting plates and the plurality of second supporting plates is perpendicular to an upper surface of the retractable plate-shaped structure, and is parallel to a rotation axis between the first supporting portion and the bending portion, wherein each of the plurality of first supporting plates comprises a plurality of first positioning holes located on a sidewall of the first supporting plate, each of the plurality of first supporting plates, except for the first supporting plate having the greatest cross-sectional area, further comprises a first positioning portion located on the sidewall of the first supporting plate, and the first positioning portion is configured to be engaged with one of the plurality of first positioning holes for positioning, each of the plurality of second supporting plates comprises a plurality of second positioning holes located on a sidewall of the second supporting plate, and each of the plurality of second supporting plates, except for the second supporting plate having the greatest cross-sectional area, comprises a second positioning portion located on the sidewall of the second supporting plate, and the second positioning portion is configured to be engaged with one of the plurality of second positioning holes for positioning, wherein: each of the first positioning portion and the second positioning portion is a spring pin or a positioning protrusion.

2. The bending apparatus according to claim 1, wherein the bending portion is a hinge-bending structure.

3. The bending apparatus according to claim 2, wherein:

the hinge-bending structure comprises a first hinge member and a second hinge member, the first hinge member comprises a first connecting portion, a first hinge shaft and a second hinge shaft, and the first hinge shaft and the second hinge shaft are arranged on a first surface of the first connecting portion, the second hinge member comprises a second connecting portion, a third hinge shaft and a fourth hinge shaft, and the third hinge shaft and the fourth hinge shaft are arranged on a first surface of the second connecting portion, and the first surface of the first connecting portion is arranged in parallel with the first surface of the second connecting portion, the first hinge shaft and the third hinge shaft are configured to connect the first supporting portion, and the second hinge shaft and the fourth hinge shaft are configured to connect the second supporting portion.

4. The bending apparatus according to claim 3, wherein each of the first hinge shaft and the third hinge shaft is in an interference fit with the first supporting portion, and is rotatable relative to the first supporting portion, and each of the second hinge shaft and the fourth hinge shaft is in an interference fit with the second supporting portion and is rotatable relative to the second supporting portion.

5. The bending apparatus according to claim 1, wherein:

the retractable plate-shaped structure is a sealed chamber, the sealed chamber is located in a flexible film structure having a sealed cavity, a first vent and a second vent, the bending portion is arranged in the flexible film structure, and the sealed cavity is separated into two sealed chambers through the bending portion, the sealed chamber is a rigid plate-shaped supporting structure in case of being filled with gas, and the first vent is arranged on a side of the first supporting portion away from the bending portion, and the second vent is arranged on a side of the second supporting portion away from the bending portion.

6. A display device, comprising:

the flexible display panel and the bending apparatus according to claim 1, wherein the end of the first supporting portion away from the bending portion is fixedly connected to the flexible display panel, and the end of the second supporting portion away from the bending portion is fixedly connected to the flexible display panel.

7. The display device according to claim 6, further comprising a supporting member, wherein the supporting member is arranged between the flexible display panel and the bending apparatus comprising the first supporting portion, the second supporting portion and the bending portion.

8. The display device according to claim 7, wherein:

the bending apparatus further comprises an auxiliary apparatus and a package structure, the package structure comprises a holding cavity and a display opening, a bottom surface of the holding cavity is configured to arrange the first supporting portion and the second supporting portion, and two ends of the supporting member are respectively fixedly connected to the packaging structure at two ends of the display opening along the first direction, the flexible display panel is arranged on a side of the supporting member away from the first supporting portion, and flexible display panel is exposed by the display opening, the auxiliary apparatus comprises a first auxiliary member and a second auxiliary member, the first auxiliary member comprises a first connecting hole, a first limiting slot and a second limiting slot, the second auxiliary member comprises a second connecting hole, a third limiting slot and a fourth limiting slot, the first connecting hole is configured to connect the bending portion, and the second connecting hole is configured to connect the bending portion, and two sides of the supporting member are arranged in the first limiting slot and the third limiting slot, a side of the first supporting portion is arranged in the second limiting slot, and a side of the second supporting portion is arranged in the fourth limiting slot.

9. The display device according to claim 8, further comprising a first roller and a second roller, wherein:

the first roller and the second roller are arranged on the bending portion, and the first roller and the second roller are rollable on a surface of the supporting member away from the first supporting portion.

10. The display device according to claim 7, wherein:

the supporting member comprises a first region and a second region surrounding the first region, and the first region is fixedly connected to the flexible display panel, the bending apparatus further comprises four supporting posts fixedly connected to the supporting member, and orthographic projections of the four supporting posts on the supporting member is located within the second region, the first supporting portion further comprises two first sliding holes, and the two first sliding holes are engaged with two of the four supporting posts, so that the retractable plate-shaped structure of the first supporting portion is slidable along the supporting post, and the second supporting portion further comprises two second sliding holes, and the two second sliding holes are engaged with another two of the four supporting posts, so that the retractable plate-shaped structure of the second supporting portion is slidable along the supporting post.

11. A bending apparatus, comprising:

a first supporting portion, a second supporting portion and a bending portion, wherein:

each of the first supporting portion and the second supporting portion is formed by a retractable plate-shaped structure, the first supporting portion is rotatably connected to the bending portion, and the second supporting portion is rotatably connected to the bending portion, wherein the retractable plate-shaped structure comprises a plurality of plate-shaped structures which are successively connected in an end-to-end manner, and adjacent plate-shaped structures are slidable relative to each other, the first supporting portion comprises a plurality of third supporting plates, and a plurality of first connecting blocks connecting adjacent ones of the plurality of third supporting plates, each of the plurality of third supporting plates comprises a first slide rail located on a first sidewall of the third supporting plate, and the first slide rail extends in a first direction, two ends of each of the plurality of first connecting blocks are respectively embedded into first slide rails of ones of the plurality of third supporting plates adjacent to the first connecting block, and are movable in the first slide rails in the direction in which the first slide rails extend, the second supporting portion comprises a plurality of fourth supporting plates, and a plurality of second connecting blocks connecting adjacent ones of the plurality of fourth supporting plates, each of the plurality of fourth supporting plates comprises a second slide rail located on a first sidewall of the fourth supporting plate, and the second slide rail extends in the first direction, and two ends of each of the plurality of second connecting blocks are respectively embedded into second slide rails of ones of the plurality of fourth supporting plates adjacent to the second connecting block, and are movable in the second slide rails in the direction in which the second slide rails extend.

12. The bending apparatus according to claim 11, further comprising:

a third positioning portion arranged on each of the plurality of first connecting blocks, and a fourth positioning portion arranged on each of the plurality of second connecting blocks, wherein each of the plurality of the third supporting plates further comprises a plurality of first positioning grooves located in the first slide rail, and the third positioning portion is configured to be engaged with one of the plurality of the first positioning grooves for positioning; and each of the plurality of the fourth supporting plates further comprises a plurality of second positioning grooves located in the second slide rail, and the fourth positioning portion is configured to be engaged with one of the plurality of the second positioning grooves for positioning.

13. A bending apparatus, comprising:

a first supporting portion, a second supporting portion and a bending portion, wherein:

each of the first supporting portion and the second supporting portion is formed by a retractable plate-shaped structure, the first supporting portion is rotatably connected to the bending portion, and the second supporting portion is rotatably connected to the bending portion, wherein the retractable plate-shaped structure comprises a plurality of plate-shaped structures which are successively connected in an end-to-end manner, and adjacent plate-shaped structures are slidable relative to each other, the first supporting portion comprises a fifth connecting portion and a plurality of sixth connecting portions;

a surface of the fifth connecting portion is provided with two first slots extending in a first direction, an end of the fifth connecting portion is configured to connect the bending portion;

each of the plurality of sixth connecting portions comprises two second slots extending in the first direction and two first latchings, the two second slots are arranged on a surface of the sixth connecting portion, the two first latchings are arranged on an end of a first side surface of the sixth connecting portion close to the bending portion, and the first side surface of the sixth connecting portion is parallel to the first direction;

the two first latchings are configured to be engaged with the two second slots of an adjacent one of the plurality of sixth connection portions for being slidably connected to the sixth connecting portion, or to be engaged with the two first slots of the fifth connecting portion for being slidably connected to the fifth connecting portion;

the second supporting portion comprises a seventh connecting portion and a plurality of eighth connecting portions;

a surface of the seventh connecting portion is provided with two third slots extending in the first direction, an end of the seventh connecting portion is configured to connect the bending portion;

each of the plurality of eighth connecting portions comprises two fourth slots extending in the first direction and two second latchings, the two fourth slots are arranged on a surface of the eighth connecting portion, the two second latchings are arranged on an end of a first side surface of the eighth connecting portion close to the bending portion, and the first side of the eighth connecting portion is parallel to the first direction; and the two second latchings are configured to be engaged with the two fourth slots of an adjacent one of the plurality of eighth connection portions for being slidably connected to the eighth connecting portion, or to be engaged with the two third slots of the seventh connecting portion for being slidably connected to the seventh connecting portion.

14. The bending apparatus according to claim 13, wherein:

the fifth connecting portion further comprises a plurality of third positioning grooves arranged on a surface of the fifth connecting portion, each of the plurality of sixth connecting portions further comprises a plurality of third positioning grooves arranged on a surface of the sixth connecting portion, and each of the plurality of third positioning grooves is configured to be engaged with the first latching of an adjacent one of the plurality of sixth connecting portions for positioning, and the seventh connecting portion further comprises a plurality of fourth positioning grooves arranged on a surface of the seventh connecting portion, each of the plurality of eighth connecting portions further comprises a plurality of fourth positioning grooves arranged on a surface of the eighth connecting portion, and each of the plurality of fourth positioning grooves is configured to be engaged with the second latching of an adjacent one of the plurality of eighth connecting portions for positioning.

* * * * *